United States Patent [19]

O'Neill et al.

[11] Patent Number: 4,847,520

[45] Date of Patent: Jul. 11, 1989

[54] FAST PNP TRANSISTOR TURN-OFF CIRCUIT

[75] Inventors: Dennis P. O'Neill, Mountain View; Carl T. Nelson, San Jose, both of Calif.

[73] Assignee: Linear Technology Corporation, Milpitas, Calif.

[21] Appl. No.: 91,548

[22] Filed: Aug. 31, 1987

[51] Int. Cl.[4] .................. H03K 3/33; H03K 3/013; H03K 4/58; H03K 17/04

[52] U.S. Cl. .................. 307/296.1; 307/255; 307/300; 307/630; 323/289

[58] Field of Search ............... 307/255, 254, 270, 280, 307/300, 313, 297, 630, 637, 253, 273; 323/289

[56] References Cited

U.S. PATENT DOCUMENTS

| | | | |
|---|---|---|---|
| 3,766,414 | 10/1973 | Blackburn et al. | 307/297 |
| 3,784,844 | 1/1974 | McGrogan, Jr. | 307/270 |
| 3,825,774 | 7/1974 | Van Kessel et al. | 307/260 |
| 4,006,370 | 2/1977 | Erler | 307/300 |

OTHER PUBLICATIONS

"Inductor and Emitter Follower Remove Stored Charge to Turn Off 4 A in 20 ns", By Erick Burwen, from Electronic Design, 19, Sep. 13, 1979; p. 154.

"Turn Off Circuit", by D. E. Norton, from IBM Technical Disclosure Bulletin, vol. 7, No. 6, Nov. 1964; p. 428.

*Primary Examiner*—Stanley D. Miller
*Assistant Examiner*—Nancy Thai
*Attorney, Agent, or Firm*—Mark D. Rowland

[57] ABSTRACT

A circuit is provided for reducing the turn-off transition time of a switching PNP transistor by providing a reverse drive current to the base of the PNP transistor after the drive current has been removed from the base. The reverse drive current is generated by an NPN transistor, the emitter of which is connected to the base of the PNP transistor. A capacitor coupled to the base of the NPN transistor is charged and during the conducting period of the PNP transistor and discharged after the drive current is removed from the base of the PNP transistor to enable the base of the NPN transistor to be driven above the supply voltage connected to the emitter of the PNP transistor.

19 Claims, 2 Drawing Sheets

FAST PNP TRANSISTOR TURN-OFF CIRCUIT

BACKGROUND OF THE INVENTION

The present invention relates to a circuit for controlling the operation of a PNP transistor, and more particularly, to a circuit for reducing the delay in the transition time of a PNP transistor caused by stored base charge in the transistor as the transistor changes from a conducting state to a non-conducting state.

PNP transistors are often employed as switching elements in integrated circuits such as switching voltage regulators. Typically, during normal switching, the PNP transistor is cycled "on" and "off" to control a flow of current between the emitter and collector by intermittently supplying a forward biasing or drive current to the transistor. During "on" periods of the switch, an amount of charge is stored in the base of the transistor. When the drive current is removed, the emitter-base junction of the PNP transistor is caused to remain forwardbiased for a period of time by the stored charge, and the transistor continues to conduct current between its emitter and collector during the period of time required for the stored charge to decay. The stored charge increases the time for the transistor to transition from a conducting state to a non-conducting state, resulting in delayed switching. When the transistor is driven into saturation by the drive current, the charge stored in the base must be discharged before any reduction in the current conducted between the emitter and collector of the transistor can take place following the removal of the drive current. Because PNP transistors employed as switching elements often are driven into saturation to enable the transistors to conduct large currents efficiently, the delay in transition time caused by the stored charge may be several microseconds long, during which time a significant amount of current may be conducted by the PNP transistor after the drive current is removed from its base. This delay limits the switching speed of the transistor.

The discharge period of the stored charge can be reduced by applying a reverse drive current to the base of the switching PNP transistor. The greater the amount of reverse drive current which can be driven into the base of the PNP transistor, the faster the stored charge can be discharged. The resulting increase in the discharge rate of the stored charge reduces the transition time of the transistor. To drive the PNP transistor quickly into a non-conducting state, the reverse drive current must be able to drive the base voltage of the PNP transistor close to the level of the voltage at its emitter.

In view of the foregoing, it would be desirable to be able to provide a circuit for generating a reverse drive current which is capable of driving the base voltage of a PNP transistor substantially close to the level of the voltage at its emitter to discharge the stored charge in the base of the PNP transistor.

SUMMARY OF THE INVENTION

It is therefore an object of the present invention to provide a circuit for supplying a reverse drive current to a PNP transistor to discharge stored charge in the base of the PNP transistor and to reduce the time it takes for the PNP transistor to transition from a conducting to a nonconducting state.

This and other objects of the present invention are accomplished by a circuit in which the emitter of an NPN transistor supplies a reverse drive current to the base of the switching PNP transistor when the forward drive current for the switching PNP transistor is removed. A charged capacitor is connected to the base of the NPN transistor. The capacitor raises the voltage at the base of the NPN transistor to a level which is higher than the voltage at the emitter of the PNP transistor, to enable the NPN transistor to turn on and conduct reverse drive to the PNP transistor. The capacitor is charged during the time that forward drive current is provided to the base of the switching PNP transistor.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
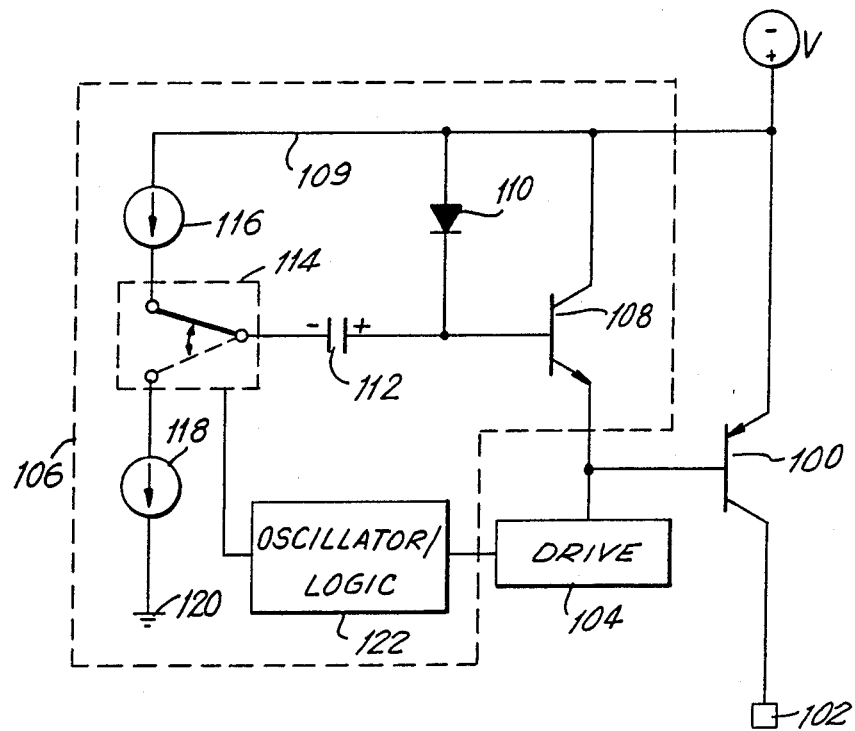
FIG. 1 is a simplified diagram of a circuit having a PNP switching transistor, the circuit including the fast PNP transistor turn-off circuit of the present invention.

Referring to FIG. 1, transistor 100 is a conventional integrated circuit PNP transistor. The emitter of PNP transistor 100 is connected to voltage supply V, and the collector of PNP transistor 100 is connected to terminal 102. The base of PNP transistor 100 is connected to drive circuit 104 which controls the emitter-base drive current to the PNP transistor 100 to control the flow of current between voltage supply V and terminal 102. Drive circuit 104 is a conventional circuit which enables forward drive current in PNP transistor 100 to be conducted on an intermittent basis to turn PNP transistor 100 "on" and drive it into a conducting state for predetermined periods of time, during which periods current flows from voltage supply V to terminal 102. In this manner, a controlled flow of switched current may be provided to circuitry connected to terminal 102. For example, the switched current may be utilized by other circuitry (not shown) implementing a switched capacitor voltage regulator.

To cause PNP transistor 100 to conduct current from its emitter to its collector, drive circuit 104 must cause a voltage differential to be created across the emitter-base junction of the transistor sufficient to forward-bias the junction and cause the base of PNP transistor 100 to conduct drive current. Over a large portion of the transistor's operating range (in its linear range), small increases in drive current conducted by the base of PNP transistor 100 result in large proportional increases in the current conducted by the transistor from its emitter to its collector. Over this same range, the collector-base junction of PNP transistor 100 is reverse-biased. As the current conducted by the base increases, however, the collectorbase junction becomes forward-biased. This causes PNP transistor 100 to operate in saturation. Further increases in the base current drive PNP transistor 100 deeper into saturation without significant increase in the current conducted between its emitter and collector.

To minimize the amount of power dissipated in a switching PNP transistor while it is conducting, the transistor's drive current is typically chosen to be of sufficient magnitude to cause the transistor to operate in light saturation. This minimizes the voltage drop across the emitter and collector of the transistor, and improves the power efficiency of the transistor. Deep saturation is preferably avoided to minimize power dissipation in the drive circuit.

As drive current is conducted by the base of PNP transistor 100, an amount of charge is stored in the base of the transistor. When the drive current is switched off by drive circuit 104, this charge must be discharged from the base before the current conducted from the emitter to the collector of PNP transistor 100 can be reduced to zero. With zero drive current, the stored charge will decay exponentially to zero with a time constant equal to the minority charge carrier lifetime of the base material. If the transistor was in saturation before the drive current was switched off, the current conducted between the emitter and collector will remain at or close to its saturation value until the stored charge in the base decays to the charge level corresponding to the onset of saturation, after which the current conducted between the emitter and collector falls exponentially with the decay of the stored charge.

Thus the stored charge delays the transition of PNP transistor 100 from a conducting state to a non-conducting state, and limits the switching speed of PNP transistor 100, particularly when PNP transistor 100 is driven into saturation by drive circuit 104.

Fast turn-off circuit 106 of the present invention shortens the delay in the turn-off transition of PNP transistor 100 by providing a reverse drive current to the base of PNP transistor 100 when the drive current provided by drive circuit 104 is switched off. The reverse drive current causes the charge stored in the base of PNP transistor 100 to decay at a rate which is faster than the rate of decay which occurs when the forward drive current is switched to zero. The rate of decay resulting from the application of reverse drive current is a function of the magnitude of the applied reverse drive current.

Fast turn-off circuit 106 includes NPN transistor 108, the emitter of which is connected to the base of PNP transistor 100 to provide a reverse drive current to the base of PNP transistor 100 when the drive current provided by drive circuit 104 is switched to zero. The collector of NPN transistor 108 is connected at node 109 to voltage supply V. The base of NPN transistor 108 is connected to the cathode of diode 110 (which may be a conventional diode-connected transistor) and to one end ("+") of junction or other type of capacitor 112. The anode of diode 110 is connected to node 109. The other end ("−") of capacitor 112 is connected to one end of switch 114, the other end of which is connected to either current source 116 or current source 118 depending upon the state of the switch. Current sources 116 and 118 may be constant current sources as shown in FIG. 1, or other circuits for supplying current.

Oscillator/logic circuit 122 causes drive circuit 104 to provide drive current to PNP transistor 100 for a predetermined period of time. During the time when drive current is provided by drive circuit 104 to PNP transistor 100, oscillator/logic circuit 122 also causes current source 118 to be connected by switch 114 to the "−" end of capacitor 112. This causes capacitor 112 to conduct a current, and capacitor 112 charges. Diode 110 provides a current path for the charging current and clamps the voltage of the "+" end of capacitor 112 to a value equal to the supply voltage V less the voltage dropped across diode 110.

When oscillator/logic circuit 122 causes drive circuit 104 to switch off the drive current to PNP transistor 100. Oscillator/logic circuit 122 also causes switch 114 to switch and connect the "−" end of capacitor 112 to current source 116, as shown in FIG. 1. The connection of the "−" end of capacitor 122 to current source 116 causes the voltage at the "−" end to increase. This causes an increase in the voltage at the "+" end of capacitor 112 and at the base of transistor 108. Current source 116 supplies a current to capacitor 112 which discharges capacitor 112 and drives NPN transistor 108. Thus, NPN transistor 108 is turned on and conducts a reverse drive current to the base of PNP transistor 100 to reduce the turn-off transition time of transistor 100. The magnitude of the current provided by current source 116 sets the magnitude of the drive current for NPN transistor 108, and is chosen to cause NPN transistor 108 to conduct sufficient reverse drive current to the base of PNP transistor 100 to achieve a desired turn-off transition time for PNP transistor 100. Preferably, the value of current source 116 is chosen to be sufficient to drive NPN transistor 108 into saturation to ensure that PNP transistor 100 is reversebiased into a non-conducting state.

Another factor to be considered in choosing the magnitude of the current provided by current source 116 is that NPN transistor 108 should provide sufficient reverse drive current to the base of PNP transistor 100 during turn-off (in addition to the reverse drive current required to discharge the stored charge) to prevent PNP transistor 100 from conducting if the voltage at its collector swings from a high value (near that of voltage supply V) to a low value (set by the circuitry connected to terminal 102). Such a voltage swing may occur, for example, if the circuitry connected to terminal 102 pulls the voltage at terminal 102 to ground (or to a negative voltage) as PNP transistor 100 is turned off. The collector-base junction of PNP transistor 100 has a capacitance which causes PNP transistor 100 to conduct current as the collector voltage swings. Fast turn-off circuit 106 should provide a sufficient reverse drive current to charge this capacitance as the voltage level of the collector swings from high to low during turn-off, or PNP transistor 100 will draw a charging current through its emitter-base junction which will cause PNP transistor 100 to turn on after the forward drive current provided by drive circuit 104 has ceased. The magnitude of the required reverse drive current is determined by the capacitance of the collectorbase junction and the change in voltage at the collector during the transition of PNP transistor 100 from a conducting to a non-conducting state.

The voltage pulse provided to the base of NPN transistor 108 by capacitor 112 raises the base voltage of NPN transistor 108 to approximately a diode drop above the emitter voltage of PNP transistor 100, preferably for at least one microsecond. This provides sufficient time for PNP transistor 100 to transition from a conducting to a non-conducting state, and for the collector of PNP transistor 100 to swing to the voltage level set by the circuitry connected to terminal 102. The peak charge voltage across capacitor 112 is determined by the magnitude of the current conducted by current source 118 during the charging period of capacitor 112, the duration of the charging period, and the capacitance and breakdown voltage of capacitor 112. The duration of the voltage pulse is determined by the discharge rate of the voltage across capacitor 112, which in turn is set by the magnitude of the current supplied by current source 116 and the size of capacitor 112. Thus, the amount of time during which the base of NPN transistor 108 is driven by the voltage pulse is determined by current sources 116 and 118, and the duration of the charging period of capacitor 112. Since the charging period for capacitor 112 is typically longer than the required discharge time, the magnitude of current supplied by current source 118 can be smaller than that of current source 116.

Because switching transistors typically operate over a range of supply voltages and switching frequencies, the magnitude of the charging current provided by current source 118 and the capacitance of capacitor 112 should be chosen to provide sufficient base drive current to NPN transistor 108 at the lowest supply voltage and highest frequency at which PNP transistor 100 is to be operated. The breakdown voltage of capacitor 112 (which, for a typical junction capacitor, is approximately 6 volts) limits the amount of charge which can be placed on capacitor 112. In the circuit of FIG. 1, assuming a supply voltage V as low as 3.5 volts and a switching frequency of approximately 20 KHz, current source 118 preferably conducts a current of approximately 50 microamps, and capacitor 112 preferably has a capacitance of 100 pF. Given these parameters, current source 116 preferably conducts a current of approximately 150 microamps to set the base drive current for NPN transistor 108.

As an alternative to the configuration of switch 114 shown in FIG. 1, switch 114 can be implemented using separate transistor switches to independently control current sources 116 and 118. If power dissipation is of less concern, another alternative is to permit current source 118 to continuously draw current from a node to which the "−" end of capacitor 112 is connected, and to connect current source 116 to the same node through a switch which permits current source 116 to supply current to the node only during the discharge period of capacitor 112. This results in an effective discharge current through capacitor 112 equal to the difference between the magnitudes of the currents conducted by current sources 116 and 118.

Fast turn-off circuit 106, PNP transistor 100 and drive circuit 104 may be implemented as a monolithic integrated circuit using conventional techniques, devices and structures.

Figure 2:
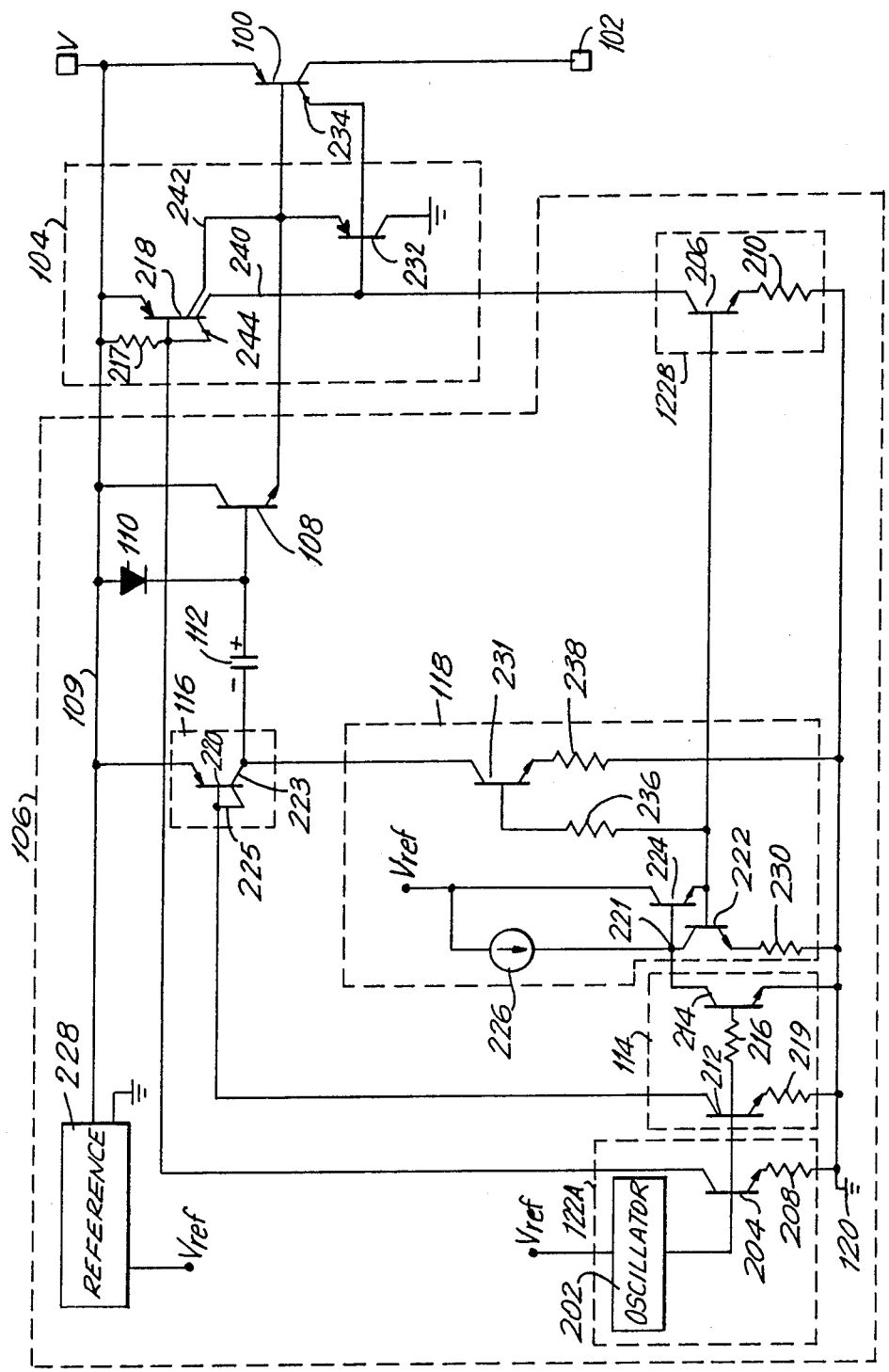
FIG. 2 is a more detailed schematic diagram of the circuit of the present invention shown in FIG. 1.

Referring now to FIG. 2, a schematic diagram of a preferred embodiment of fast turn-off circuit 106 of the present invention is shown for use in an integrated circuit switched capacitor voltage converter. Voltage supply V is provided by the input voltage applied to the converter, and may vary over a range of 3.5 to 15 volts. PNP transistor 100 switches between a conducting state and a nonconducting state at a frequency set by circuits 122A and 122B to control a flow of current beween voltage supply V and terminal 102.

Circuits 122A and 122B together correspond to oscillator/logic circuit 122 of FIG. 1, and include a conventional oscillator 202, transistors 204 and 206, and resistors 208 and 210. Circuits 122A and 122B provide control signals which control operation of switch 114 and drive circuit 104. Oscillator 202 generates a timing signal which preferably takes the form of a 20 KHz square wave.

The timing signal generated by oscillator 202 is provided to the bases of transistor 204, 212 and 214. Transistor 204, the collector of which is connected to the base and a collector of transistor 218 of drive circuit 104, responds to the timing signal to turn off drive circuit 104 when the timing signal goes high. Transistors 212 and 214 comprise switch 114. Transistor 212, the collector of which is connected to the base and a collector of transistor 220 of current source 116, responds to the timing signal to turn current source 116 on when the timing signal goes high and to turn it off when the timing signal goes low. Transistor 214, the collector of which is connected to node 221 of current source 118, responds to the timing signal to turn current source 118 on when the timing signal goes low and to turn it off when the timing signal goes high. Transistor 214 also causes an inverted timing signal to be provided to the base of transistor 206, which in turn causes drive circuit 104 to provide a drive current to PNP transistor 100 when the timing signal goes low.

The operation of the circuit shown in FIG. 2 is described below in greater detail for the period when the timing signal provided by oscillator 202 is low. During this period, transistors 204, 212 and 214 are off. The off condition of transistors 204 and 212 in turn causes transistors 218 and 220 to be off. Pull-up resistor 217, which preferably has a value of 80 kohms and is connected between the base and a collector of transistor 218 and node 109, pulls the voltage at the base of transistor 218 close to supply voltage V to prevent transistor 218 from turning on when transistor 204 is off. Current source 116, which is comprised of transistor 220, is switched off when the timing signal is low.

Current source 118 is a switched constant current source. It includes transistors 222, 224 and 231, and current source 226. Transistor 224 and current source 226 are connected to voltage reference circuit 228 (Vref). Current source 118 is connected to and operated by transistor 214 as follows. The collector of transistor 214 is connected at node 221 to the collector of transistor 222, the base of transistor 224, and current source 226 as shown. Voltage reference generator circuit 228, which is a conventional voltage generator circuit preferably including a band-gap voltage reference, provides a reference voltage of approximately 2.5 volts to the collector of transistor 224, current source 226 and oscillator 202. Current source 226, which also is conventional, conducts a constant current to node 221. When transistor 214 is off, current source 226 forward biases the base-emitter junction of transistor 224, which turns transistors 222 and 224 on with the result that a current is conducted by resistor 230 from the emitter of transistor 222 to ground 120. The values of resistor 230 and the current supplied by current source 226 set the emitter voltage of transistor 222, which in turn establishes the voltage at the base of transister 222. These values are chosen to set the emitter voltage level at approximately 0.5 volts above ground, with the result that the base voltage level is approximately a diode drop higher than the 0.5 volt emitter voltage level. For this purpose, preferable values for resistor 230 and current source 226 are 6.7 kohms and 70 microamps, respectively.

The base voltage established by current source 226 and resistor 230 causes transistor 231 to turn on, and may cause it to saturate when voltage supply V is low. Resistor 236, which is connected between the base of transistor 231 and the bases of transistors 222 and 206 and the emitter of transistor 224, prevents transistor 231 from drawing excess base current away from the bases of transistors 222 and 206. Resistor 236 preferably has a value of 5.0 kohms. The collector of transistor 231 is connected to the "−" end of capacitor 112, the "+" end of which is connected to the base of transistor 108 and to the cathode of diode 110. Transistor 231 causes a current to be conducted through capacitor 112 and diode 110 to charge capacitor 112. The amount of charge placed on capacitor 112 is a function of its capacitance and breakdown voltage, the frequency of oscillator 202 and the magnitude of the current conducted by transistor 231. The magnitude of the current conducted by transistor 231 is in turn a function of the value of resistor 238, which is connected between the emitter of transistor 231 and ground 120. Preferably, capacitor 112 has a capacitance of 100pF and is charged at a current of 50 microamps, which is set by choosing the value of resistor 238 to be 10 kohms. In this manner, capacitor 112 is charged to its maximum voltage by current source 118 during the period when the timing signal provided by oscillator 202 is low and PNP transistor 100 is conducting.

The base voltage set by current source 226 and resistor 230 is also provided to the base of transistor 206, thereby causing transistor 206 to turn on and conduct a current from the base of transistor 232 of drive circuit 104. The magnitude of the current is set by resistor 210 connected between the emitter of transistor 206 and ground 120. Preferably, resistor 210 is a variable resistor having a maximum resistance of 4.8 Kohms. The current conducted by transistor 206 causes transistor 232 to turn on. This causes drive current to be conducted in the base-emitter circuit of PNP transistor 100, which in turn causes PNP transistor 100 to turn on and conduct current between supply voltage V and terminal 102. To prevent transistor 232 from driving PNP transistor 100 too far into saturation, PNP transistor 100 has a collector stripe 234 which is wrapped around a portion of its primary collector to conduct current as the primary collector starts to saturate. The current conducted by collector 234 is fed back to the base of transistor 232 to limit the drive current which transistor 232 conducts from the base of PNP transistor 100.

The operation of the circuit shown in FIG. 2 will now be described in greater detail for the period when the timing signal provided by oscillator 202 is high.

During the period that the timing signal is high, transistors 204, 212 and 214 are on, and transistor 204 conducts drive current for transistor 218. Resistor 208, which is connected between the emitter of transistor 204 and ground 120 and preferably has a value of 2.6 kohms, sets the magnitude of the drive current of transistor 218. As described in greater detail below, transistor 218 preferably provides an amount of reverse drive current to the base of transistor 232 of drive circuit 104 and to the base of PNP transistor 100 sufficient to maintain PNP transistor 100 in a non-conducting state once it has been turned off by fast turn-off circuit 106.

When the base of transistor 212 is driven high by the timing signal provided by oscillator 202, transistor 212 is turned on and causes transistor 220 also to turn on. Resistor 219, which is connected between the emitter of transistor 212 and ground 120 and preferably has a value of 1.7 kohms, sets the magnitude of the current conducted by transistor 212 to transistor 220. When transistor 220 turns on, the voltage at the "−" end of capacitor 112 increases. This causes a corresponding increase in the voltage at the "+" end of capacitor 112 and at the base of transistor 108. Transistor 220 conducts a current to the base of transistor 108 through capacitor 112. The magnitude of this current is preferably chosen to have a value of 150 microamps and is set by the magnitude of the current conducted by transistor 212 and the current gain of transistor 220. The current gain of transistor 220 is set by the collector ratio of collectors 223 and 225, which is preferably chosen to be approximately 3:1. As discussed above with respect to FIG. 1, the current conducted to the base of transistor 108 when transistor 220 turns on discharges capacitor 112, and turns on transistor 108. In this manner, transistor 108 is caused to conduct reverse base drive current to the base of PNP transistor 100, which is connected to the emitter of transistor 108, to rapidly discharge the charge which was stored in the base of PNP transistor 100 while it was conducting.

At the same time, the timing signal provided by oscillator 202 drives transistor 214 into saturation. Resistor 216, which preferably has a value of 1.6 kohms, is connected between oscillator 202 and the base of transistor 214 to prevent saturated transistor 214 from drawing excess base current away from the base of transistors 204 and 212. Transistor 214 pulls the voltage level of node 221 down toward ground, which in turn causes transistors 222, 224, 231 and 206 to turn off. Thus, when the timing signal provided by oscillator 202 goes from low to high, current source 118 is turned off by transistor 214 and, as described above, current source 116 is turned on by transistor 212.

At approximately the same time that transistor 206 is being turned off by transistor 214, transistor 218 is turned on by transistor 204 as discussed above. Collector 240 of transistor 218 conducts a reverse drive current (preferably 50 microamps) and pulls up the voltage level at the base of transistor 232. Transistors 206 and 218 thus cooperate to turn off transistor 232 and prevent it from conducting during the high period of the timing signal provided by oscillator 202. Collector 242 of transistor 218, which is connected to the base of PNP transistor 100, conducts a reverse drive current (preferably 75 microamps) to the base of PNP transistor 100 which is used to hold PNP transistor 100 in a non-conducting state during the same period once it has been driven off by fast turn-off circuit 106. The magnitudes of the currents conducted by collectors 240 and 242 are set by the magnitude of the current conducted by transistor 204 and the respective collector ratios of collectors 240 and 244, preferably 2:1, and of collectors 242 and 244, preferably 3:1.

Thus, a circuit for providing a reverse drive current to the base of a switching PNP transistor to increase the turn-off switching speed of the transistor has been described. Although preferred embodiments of the invention have been disclosed with various components connected to other components, one skilled in the art will appreciate that it may not be necessary for such connections to be direct and additional components may be interconnected between the shown connected components without departing from the spirit of the invention as shown. Further, component and other circuit values and parameters may be modified. One skilled in the art will appreciate also that the present invention can be practiced by other than the described embodiments, which are presented for purposes of illustration and not of limitation, and the present invention is limited only by the claims which follow.

What is claimed is:

1. In a circuit including a node having an associated voltage and including a PNP transistor having an emitter connected to conduct current from the node, a collector and a base, the circuit further including circuitry connected to the base of the PNP transistor for switching the PNP transistor on and off by alternately providing and removing forward base drive current to the PNP transistor, a circuit for increasing the turn-off switching speed of the PNP transistor comprising:
   an NPN transistor having a collector-emitter circuit between the node and the base of the PNP transistor, and connected to conduct reverse drive current to the base of the PNP transistor;
   a capacitor connected to conduct current into the base of the NPN transistor;
   means for charging the capacitor; and
   means for discharging the capacitor such that it discharges into the base of the NPN transistor and supplies a voltage pulse to the base of the NPN transistor, and the NPN transistor conducts reverse drive current to the base of the PNP transistor during at least a portion of the voltage pulse.

2. The circuit of claim 1, wherein the NPN transistor has a base connected to a first terminal of the capacitor.

3. The circuit of claim 1, wherein a first terminal of the capacitor is connected to the base of the NPN transistor, and wherein:
   the charging means comprises means for developing a voltage across the capacitor during at least a portion of the time during which forward base drive current is provided to the PNP transistor, such that the voltage at the first terminal exceeds that at a second terminal of the capacitor; and
   the discharging means comprises means connected to the second terminal of the capacitor for increasing the voltage at the second terminal of the capacitor at a predetermined time, whereby the capacitor produces the voltage pulse at its first terminal having a voltage level which is equal to or greater than the voltage level at the emitter of the PNP transistor.

4. The circuit fo claim 2, wherein:
   the charging means comprises means for developing a voltage across the capacitor during at least a portion of the time during which forward base drive current is provided to the PNP transistor, such that the voltage at the first terminal exceeds that at a second terminal of the capacitor; and
   the discharging means comprises means connected to the second terminal of the capacitor for increasing the voltage at the second terminal of the capacitor when the forward base drive current is removed from the PNP transistor, whereby the capacitor produces the voltage pulse at its first terminal having a voltage level which is equal to or greater than the voltage level at the emitter of the PNP transistor.

5. The circuit fo claim 4, wherein the means for developing a voltage across the capacitor during at least a portion of the time during which forward base drive current is provided to the PNP transistor comprises:
   means connected to the capacitor for conducting a first current; and
   means connected to the capacitor for causing the capacitor to conduct the first current from its first terminal to its second terminal during at least a portion of the time during which forward base drive is provided to the PNP transistor, whereby the capacitor charges and develops a voltage between its first and second terminals.

6. The circuit of claim 4, wherein the means connected to the second terminal of the capacitor for increasing the voltage at the second terminal of the capacitor when the forward base drive current is removed from the PNP transistor comprises:
   means connected to the capacitor for conducting a second current; and
   means connected to the capacitor for causing the capacitor to conduct the second current from its second terminal to its first terminal when the forward base drive current is removed from the PNP transistor, whereby the capacitor discharges.

7. The circuit of claim 3, wherein the means for developing a voltage across the capacitor during at least a portion of the time during which forward base drive current is provided to the PNP transistor comprises:
   means connected to the capacitor for conducting a first current; and
   means connected to the capacitor for causing the capacitor to conduct the first current from its first terminal to its second terminal during at least a portion of the time during which forward base drive current is provided to the PNP transistor, whereby the capacitor charges and develops a voltage between its first and second terminals.

8. The circuit of claim 3, wherein the means connected to the second terminal of the capacitor for increasing the voltage at the second terminal of the capacitor at a predetermined time comprises:
   means connected to the capacitor for conducting a second current; and
   means connected to the capacitor for causing the capacitor to conduct the second current from its second terminal to its first terminal at the predetermined time, whereby the capacitor discharges.

9. In a circuit including a first node having an associated voltage and including a PNP transistor having an emitter connected to conduct current from the first node, a collector and a base, the circuit further including circuitry connected to the base of the PNP transistor for switching the PNP transistor on and off by alternatively providing and removing forward base drive current to the PNP transistor, a circuit for increasing the turn-off switching speed of the PNP transistor comprising:
   an NPN transistor having a collector-emitter circuit in series between the first node and the base of the PNP transistor, and a base;
   a capacitor having a first terminal connected to the base of the PNP transistor, and a second terminal;
   a first current source;
   a second current source; and
   means connected to the first and second current sources, and to the first and second terminals of the capacitor, for causing the first and second current sources alternately to charge the capacitor during at least a portion of the time during which forward base drive current is provided to the PNP transistor, and to discharge the capacitor when the forward base drive current is removed from the PNP transistor.

10. The circuit of claim 9, wherein the means for causing the first and second current sources alternately to charge and discharge the capacitor includes a switch for connecting the second terminal of the capacitor to the first current source to charge the capacitor, and to the second current source to discharge the capacitor.

11. The circuit of claim 9, wherein the means for causing the first and second current sources alternately to charge and discharge the capacitor includes:
 a first switch connected to the first current source to cause the first current source to conduct a first current during at least a portion of the time during which forward base drive current is provided to the PNP transistor; and
 a second switch connected to the second current source to cause the second current source to conduct a second current when the forward base drive current is removed from the PNP transistor.

12. The circuit of claim 9, wherein the second terminal of the capacitor and the first and second current sources are connected to a second node, from which second node the first current source conducts a first current, and wherein the means for causing the first and second current sources alternately to charge and discharge the capacitor includes a switch connected to the second current source which causes the second current source to conduct a second current to the second node when the foward base drive current is removed from the PNP transistor, the second current having a magnitude which is greater than the magnitude of the first current.

13. The circuit of claim 10, wherein the means for causing the first and second current sources alternately to charge and discharge the capacitor further includes means for conducting current to the first terminal of the capacitor.

14. The circuit of claim 13, wherein the means for conducting current to the first terminal of the capacitor comprises a diode in series between the first terminal and the first node.

15. The circuit of claim 14, wherein the diode has a cathode connected to the first terminal of the capacitor and an anode connected to the first node.

16. The circuit of claim 9, wherein the first current source comprises:
 a transistor having a collectoremitter circuit in series between the second terminal of the capacitor and a third node having a voltage level less than the voltage level of the voltage supply, and a base-emitter circuit; and
 means connected to the base of the transistor and to the alternating means for biasing the base-emitter circuit of the transistor.

17. The circuit of claim 9, wherein the second current source comprises:
 a transistor having a collectoremitter circuit in series between the second terminal of the capacitor and the first node, and a base-emitter circuit; and
 means connected to the base of the transistor and the alternating means for biasing the base-emitter circuit of the transistor.

18. The circuit of claim 16, wherein the second current source comprises:
 a transistor having a collectoremitter circuit in series between the second terminal of the capacitor and the first node, and a base-emitter circuit; and
 means connected to the base of the transistor and the alternating means for biasing the base-emitter circuit of the transistor.

19. In an integrated circuit including a node having an associated voltage, and including a PNP transistor having an emitter connected to conduct current from the node, a collector and a base, the circuit further including circuitry connected to the base of the PNP transistor for switching the PNP transistor between a saturated state and a non-saturated state, a circuit for reducing the time required for the PNP transistor to switch from a saturated state to a non-saturated state, comprising:
 semiconductor means responsive to a first current, and requiring a voltage source equal to or greater than the voltage associated with said node, for providing a reverse drive current to the base of the PNP transistor, the reverse base drive current having a greater magnitude than the first current; and
 a capacitor connected to the reverse drive current means for conducting the first current to the reverse base drive current means at a voltage level equal to or greater than the voltage associated with said node such that the reverse base drive current means is capable of driving the voltage at the base of the PNP transistor above the base voltage level required to maintain the PNP transistor in a saturated state, whereby the PNP transistor is driven from a saturated state into a nonsaturated state by the reverse base drive current means.

* * * * *

UNITED STATES PATENT AND TRADEMARK OFFICE
CERTIFICATE OF CORRECTION

PATENT NO. : 4,847,520
DATED : July 11, 1989
INVENTOR(S) : Dennis P. O'Neill and Carl T. Nelson It is certified that error appears in the above-identified patent and that said Letters Patent is hereby corrected as shown below:

Claim 4, Column 9, line 42, "fo" should be -- of--;

Claim 5, Column 9, line 58, "fo" should be -- of--;

Claim 9, Column 10, line 53, "PNP" should be -- NPN --;

Claim 16, column 11, line 43, "collectoremitter" should be -- collector-emitter --;

Claim 17, column 12, line 6, "collectoremitter" should be -- collector-emitter --;

Claim 18, column 12, line 14, "collectoremitter" should be -- collector-emitter --.

Signed and Sealed this

Twenty-sixth Day of March, 1991

Attest:

HARRY F. MANBECK, JR.

*Attesting Officer*  *Commissioner of Patents and Trademarks*